United States Patent [19]

Ibar et al.

[11] Patent Number: 4,608,532
[45] Date of Patent: Aug. 26, 1986

[54] MULTI-PROBE METERING APPARATUS

[75] Inventors: Jean P. Ibar, Villiers S/Orge, France; John R. Saffell, Farway Barton, Great Britain

[73] Assignee: Solomat S.A., Ballainvilliers, France

[21] Appl. No.: 545,983

[22] Filed: Oct. 27, 1983

[30] Foreign Application Priority Data

Dec. 3, 1982 [FR] France .................................. 82 20364

[51] Int. Cl.$^4$ ...................... G01R 15/08; G01R 15/10; G01D 5/12
[52] U.S. Cl. .................................. 324/73 R; 324/115; 324/132; 364/556
[58] Field of Search ...................... 324/73 R, 115, 132; 364/573, 556, 558

[56] References Cited

U.S. PATENT DOCUMENTS

| 2,836,793 | 5/1958 | Kelley | 324/115 |
|---|---|---|---|
| 3,619,776 | 11/1971 | Kinninger | 324/115 |
| 4,254,375 | 3/1981 | Matsuoka | 324/115 |
| 4,349,886 | 9/1982 | Ibar | 324/132 X |
| 4,473,797 | 9/1984 | Shiota | 324/115 |

OTHER PUBLICATIONS

Hatch, R., "Microprocessor Multiplies a Digital Multimeter's Functions" Electronics, Sep. 16, 1976, pp. 97–101.

Primary Examiner—Jerry W. Myracle
Assistant Examiner—Stephen M. Baker
Attorney, Agent, or Firm—Seidel, Gonda, Goldhammer & Abbott

[57] ABSTRACT

A multi-probe metering apparatus is characterized by a central unit (I) comprising various signal processing circuits and modules (II) having two gates (A, B) to which are connected various pick-ups (III). The central unit (I) communicates with the module (II) via a numerical signal link (10) for the transmission of pick-up identification signals, and by two analogue links (9, 9b) permitting simultaneous connection of two pick-ups.

9 Claims, 3 Drawing Figures

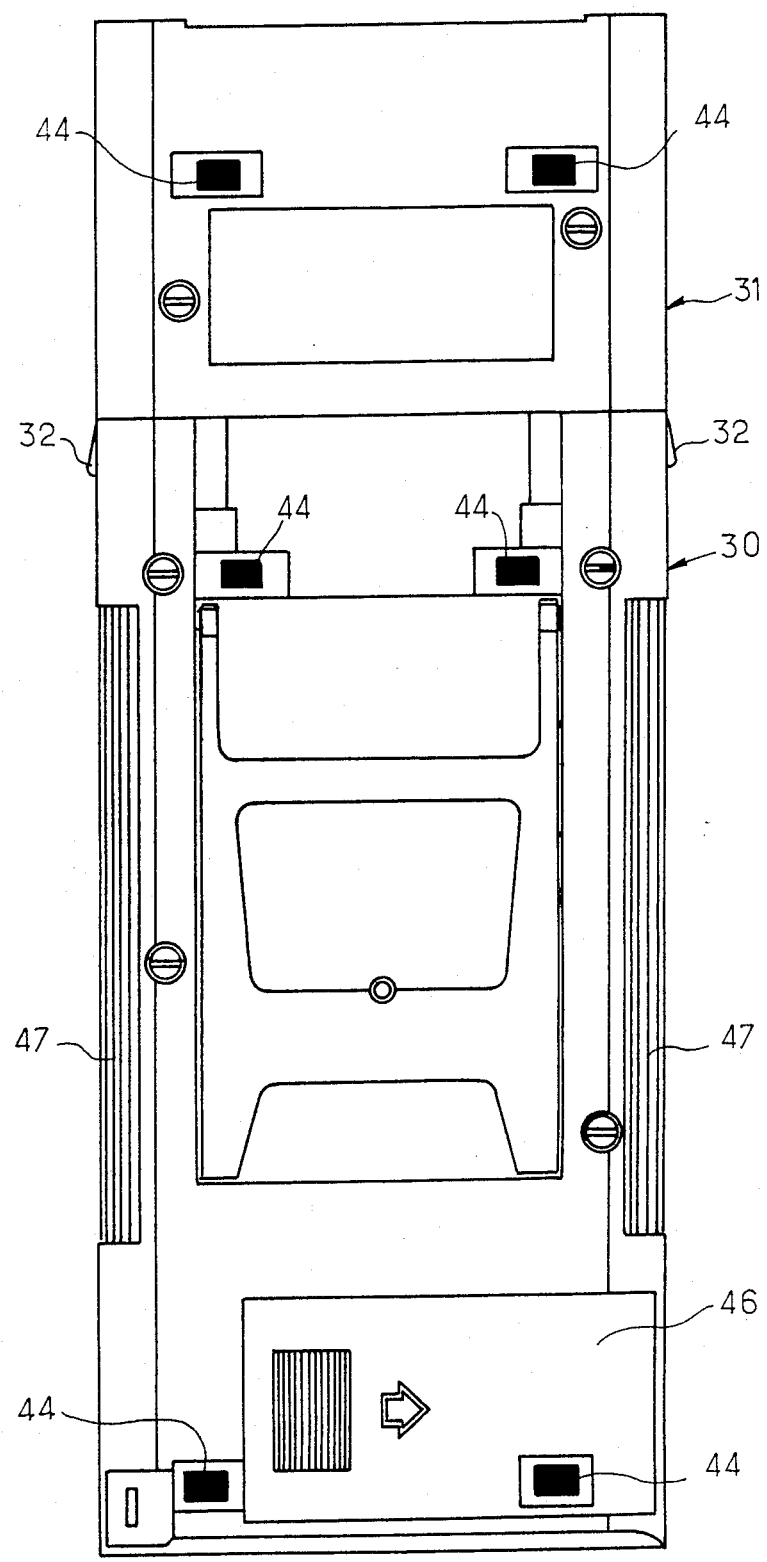

MULTI-PROBE METERING APPARATUS

The present invention relates to a multi-probe metering apparatus for measuring electrical magnitudes or values linked with electrical magnitudes and for displaying the results or transmitting them to users.

In their simplest form, the metering apparatuses consist of a pick-up and an electronic circuit for processing signals supplied by the pick-up and a display means or more generally an output system.

The design and manufacture of metering apparatuses are enjoying a development boom because analogue-numerical pick-ups and converters are becoming more accurate and less expensive, display means and control circuits are improving and the use of micro-processors on a single circuit board permits of low consumption.

These various developments which have modified the design of metering apparatus are clearly apparent when portable metering apparatus is involved. Whereas previously portable thermometers or pH meters did nothing more than deflect a pointer along a scale or provide a numerical display, more elaborate instruments or apparatuses are now marketed and may be classified as follows:

(1) Instruments whose function is to carry out one or two types of measuring process with a numerical display. These instruments make use of the industrial progress mentioned earlier, mainly with a view to reducing the cost of the instrument.

(2) Instruments equipped with a micro-processor and capable of carrying out one or two types of measurement, but which are provided in a form and for a use which are very flexible and practical. One example of such instruments is a voltmeter which measures resistances, voltages and current strengths. A selector switch on the instrument makes it possible to change from one form of measurement to another.

(3) Central metering units of the universal type capable of accepting a very large number of input signals but requiring specific adaptation of the electronic circuits to each type of pick-up and specific programmes for analysing data. These units are not generally portable and their use requires the purchase of highly specific pick-ups corresponding to the electronic wiring layout in the unit. Quite often, their sophistication is such that they provide analogue and numerical output of the signals processed.

The object of the present invention is to create an apparatus which combines the advantages of the metering units of type 2 and 3. This new type of instrument employs a micro-processor to carry out the following tasks:

(1) to make the unit more capable of interpreting an input signal and of providing the result for display with a suitable resolution;

(2) to make the unit more polyvalent so that it can accept a wide diversity of pick-ups without additional electronic preparation;

(3) provide a complete range of analogue and numerical output signals which make it possible to actuate relays for regulating and recording the parameters measured.

This apparatus is very difficult to conceive for various reasons, mainly:

(1) There are a wide range of pick-ups which measure one and the same physical magnitude by different techniques and each of which requires a specific electronic processing circuit.

(2) This wide diversity of input signals to be treated is increased if one requires to measure different physical magnitudes and also needs different forms of graduation and scale marking as well as different display units for different types of measurement.

In view of these two difficulties, a portable multi-probe appliance capable of interpreting a wide range of input signals would require the use of too great a number of additional electronic circuits to process the various pick-ups and a very high capacity memory for recording the data relative to the various graduation, scale formation and display type constants.

The object of the present invention is to create a multi-probe apparatus which makes it possible to process a wide variety of measurements in addition to the conventional measurements such as resistance (ohms), voltage (volts), current strength (amperes) and frequency (Hertz), as is the case with already existing equipment.

The apparatus must in particular be able to process signals relating to measurements of pH, concentration, percentage relative humidity RH, temperature, pressure, distance, velocity or rate of flow of a liquid, conductivity, etc., and must be able correctly to linearise the input signal, correct the effect of temperature if necessary, relate the result in correct units, modify the output according to the user's instructions and provide data both for a visual display and in analogue/numerical form.

It is a further object of the invention to create an apparatus having a minimum number of processing circuits of the integrated type and of a universal nature for processing electrical signals originating from more than one type of pick-up.

It is likewise an object of the invention to create an instrument capable of receiving numerical data from one of the processing circuits above, for determining the type of pick-up used, the unit of measurement, the resolution sought and other appropriate data.

It is likewise an object of the invention to create an apparatus which makes it possible to reduce the memory space needed to record pick-up linearisation data and for relating them to a scale.

It is likewise an object of the invention to create an apparatus which satisfies certain commands of the user, including:

(1) choice of resolution and unit of measurement;

(2) reading of minimum, maximum and mean values;

(3) output of corresponding data: display data, analogue data and numerical data in parallel and in series.

To this end, the invention relates to an apparatus characterised by a modular structure consisting of a central unit comprising an input signal acquisition circuit which feeds signals to a processing circuit with a memory supplying the display means and providing for the output of signals for users, and comprising at least one detachable module constituting the link between the central unit and the pick-up or pick-ups, this module being associated with one or a plurality of specific pick-ups, this module being itself connected to the central unit via electrical links which are established at the same time as the mechanical link is made between the module and the central unit, each module comprising processing circuits linked with the pick-ups which this module may accept, and means for providing the central unit with information to identify the pick-up or pick-ups with which the module is associated so that in the central unit it can control the processing corresponding to the signals provided by the pick-up(s), each module having two input gates connected by two different routes to the central unit which receives and processes separately and independently the signals from the two routes in order to combine them.

The modular apparatus is a new solution for portable appliances, because it enables the user first to buy a main unit which comprises the micro-processor, an input signal acquisition circuit, e.g., an A/D converter, or any other type of input signal acquisition circuit, the precision components, the numerical display and the output circuit as well as the supply. The modules are bought separately and as a function of the needs of the user and they constitute the interface for the various pick-ups or groups of pick-ups. These modules are designed with a view to covering all the measurements of physical magnitude which the user wishes to measure, by the purchase of a single multi-pick-up module or a small number of modules.

The processing circuits 15 utilize the following linearization formula:

$$Y = A + Bx + \frac{(M+x)^l \cdot (N+x)^m \cdot (\ )\ldots}{(R+x)^i \cdot (S+x)^j \cdot (\ )\ldots}$$

where:

X is the value of the input to one of the processing circuits 15 on a line 13;

Y is the value of the output of one of the processing circuits 15 on lines 9 and 9b;

A, B, M, N, R and S are linearizing constants chosen to reduce the linearizing error to as small a value as possible; and l, m, i and j are numbers having values less than one and related according to the formula $l+m+i+j=1$.

U.S. Pat. No. 4,349,886 incorporated herein by reference describes a similar linearization formula for use in a linearization circuit. Those skilled in the art will readily recognize that the subfunctions $A+Bx$, $M+x$, etc. in the above formula can be implemented with electronic circuitry including a memory for storing the constants. Furthermore, the value of the constants in the memory makes it possible likewise to take into account the possible non-linearity of the processing circuits and thus to combine all the non-linearity factors.

This possibility of combining into the linearisation formula corrections for non-linearity of the electronic circuit for processing relating to scale makes it possible to use a single processing circuit for handling the inputs from several different pick-ups.

In the most general case, the analogue signals provided by the pick-up or pick-ups are transmitted to the input signal acquisition circuit, e.g., an A/D converter. Generally the converter is a numerical analogue A/D converter combined with an electronic selector which alternatively selects one or other of the two routes to which the two pick-ups are connected. The signals thus transmitted to the main unit are processed separately in numerical form according to the linearisation and compensation formula given hereinabove and the parameters of which are defined by the module according to the pick-ups connected. It is only after this independent processing that the two results of measurement are combined to give the result which is intended for display or operation.

Diagrammatically, the apparatus according to the invention combines a numerical information and an analogue information between the module and the central unit, the numerical information being provided by the module as a function of the type of pick-up and by the nature of the pick-up itself, whereas the analogue information corresponds to the result of the measurement performed by the pick-up.

The central unit interrogates the module to determine the symbol to be used in the display, the type of pick-up corresponding to this symbol (for example, for measuring the temperature, whether it be carried out by a thermocouple, a thermistor, a platinum resistance, etc.) or for hot wire or rotary screw anemometers.

This module gives the resolution for display and information about the nature of the electronic signal at input, for example whether it is a low level or high level signal: all these interrogations result in decisions at the level of processing, handling and linearising the input signal. It enquires in order to know whether it is reading 1 or 2 inputs.

This interrogation system is universal and is applied to the processing of each pick-up. Knowing all the numerical information resulting from the interrogation, the micro-processor sends the signal for example to the A/D converter.

There is a total difference between the various measuring units currently in existence and the apparatus according to the invention.

The differences are located at the level of the signals according to the present invention, the inter-action between the pick-up and the central unit (via the module) is particularly simple for the user, more versatile and more flexible due to the re-grouping of all the processing stages within the central unit and thanks to numerical interrogation carried out by the central unit in the module.

Indeed, in the central measuring unit, there is a handling circuit associated with a specific pick-up, and therefore there are as many circuits as there are pick-ups, whereas in the invention the handling circuits are universal: the variables which change as a function of the pick-up selected being determined at the moment of acquisition of data by numerical interrogation of the module by the central unit. This apparatus provides for a novel combination of input signals by a greatly improved logic arrangement for processing the data, the effects of which are demonstrated at electronic level by a considerable reduction in the number of handling circuits, that is to say due to the fact that these circuits are universal.

The apparatus is thus capable of receiving a vast number of pick-ups without any special or complicated calibration requiring a modification of the circuits.

According to another important characteristic feature, the apparatus makes it possible to measure two values simultaneously and in a completely independent fashion, for example the temperature, making it possible to compensate for the effect of this variable (temperature) on the variable which it is desired to measure.

Thanks to the two inputs (gates), the signal to be measured is applied to one of the gates, the other receiving the compensating signal (for example temperature). It is possible thus to use very different pick-ups, the reading from the second gate serving to compensate for the variable with no need for a specific circuit.

To sum up, a central measuring unit is built around a certain and particular pick-up; to use another pick-up, the user must re-standardise his pick-up and re-calibrate so that he can use the previously fixed internal processing by the central measuring unit.

In contrast to this, the apparatus according to the invention is capable of accepting a wide variety of pick-ups without distrinction thanks to the handling and interrogation circuit.

This structure of the metering apparatus, residing in regrouping the maximum number of circuits in the central measuring unit and making these modules as simple as possible, to ensure adaptation of families of pick-ups, makes it possible to increase the production run of the central measuring unit which, although complex, will remain relatively inexpensive, whereas the more specific but structurally simple modules will not be more expensive either.

Linearisation of the signals within the central measuring unit simplifies the structure of the moduls and reduces costs. Indeed, the linearisation parameters are supplied by the module when this latter is connected to the central unit or when the pick-up or pick-ups chosen is or are connected to the module (through the selector). Therefore, certain pick-ups may have a non-linear response without this complicating the module to which they are connected.

This identification of the pick-up makes it possible not only to carry out appropriate processing of the signal but also to control the display so that it is effected in suitable units, etc.

Therefore, there is a double compensation of signals, on the one hand at module level and on the other at the level of the processing programme within the central unit.

The junction between the module and the central unit ensures electrical contact between the two elements for:
  power supply, earthing and reference voltage supplied by the main unit to the module
  numerical information sent by the module to the central unit when this exchange is requested by the central unit, and
  the sending of analogue signals or cadence pulses from the module to the analogue/numerical converter when this is requested by the central unit.

The combination of analogue information in parallel and numerical information in series reduces the number of contacts needed between the central unit and the module for example.

By way of example, the total number of interface lines is reduced to 15, but this number is not critical and the minimum number of lines is probably 4. The choice of 15 is above all based on the use of a 15-way take-off which is standard, inexpensive and very viable.

According to another characteristic feature, the information identifying the pick-ups controls the parameters of linearisation of the numerical signals corresponding to the analogue signals in the central processing unit.

According to another characteristic feature, the compensating circuits provide for compensation according to different parameters such as temperature and pressure.

According to another characteristic feature, the central unit comprises means of controlling the display of magnitudes such as: minimum, maximum, mean, or of locking the display for a certain period.

According to another characteristic feature, each module comprises a selector for choosing a mode of operation.

The present invention will be described in greater detail with reference to the appended drawings, in which:

FIG. 3 is a view of the back of the apparatus in FIG. 2.

Figure 1:
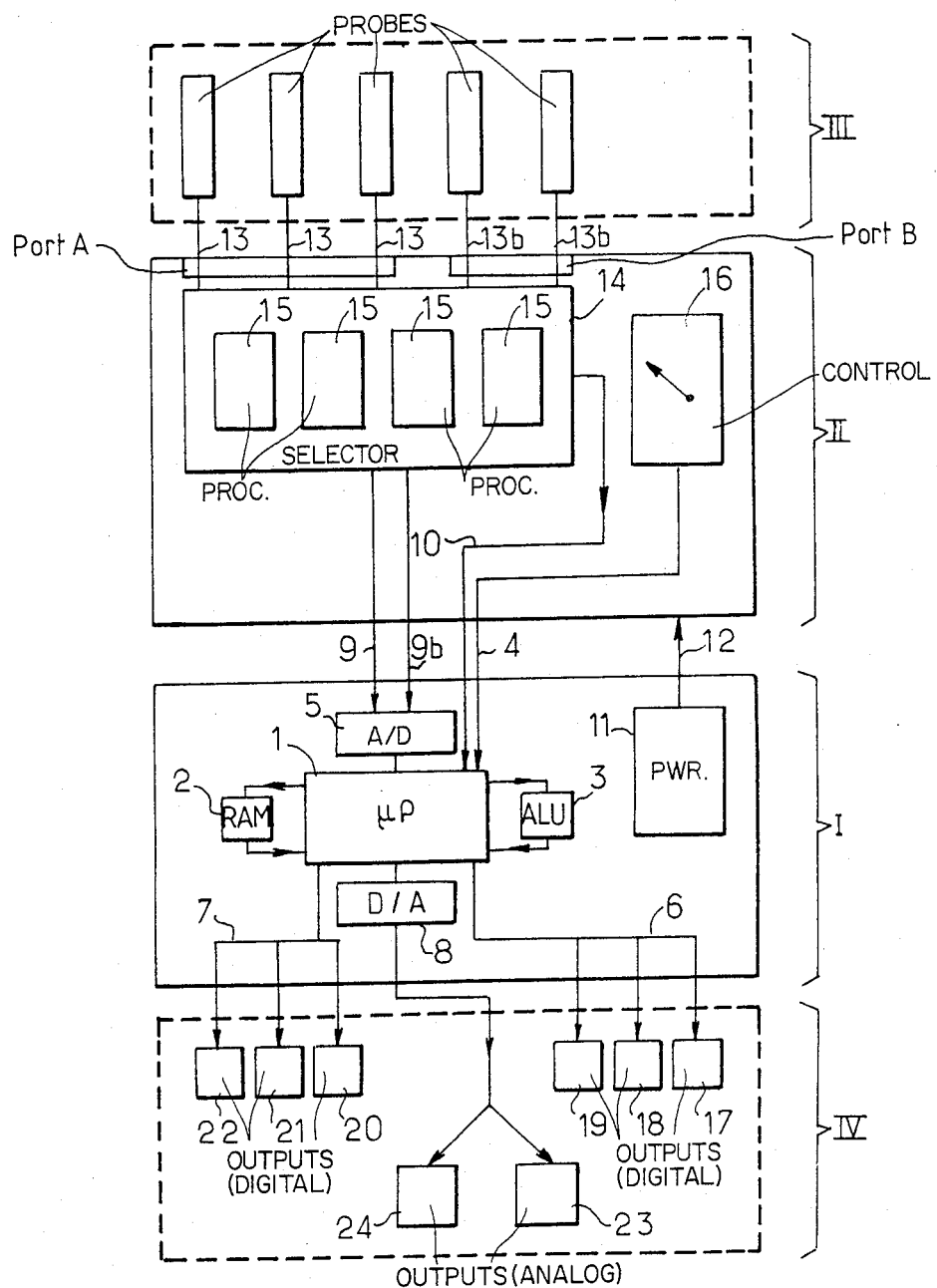
FIG. 1 is an overall diagram of an apparatus according to the invention.

As shown in FIG. 1, the apparatus is composed of four parts, viz:

The central unit I which controls the whole apparatus.

Modules II which make the link between the pick-ups and the central unit I.

Pick-ups III, such as probes tto pick up temperature, pressure, etc., which provide analogue electrical signals.

Utiliser circuits IV such as display circuits, control circuits, etc.

The central unit I consists of a micro-processor I connected to a live memory RAM 2, an arithmetic and logic unit ALU 3. Access to the micro-processor 1 is either direct when numerical signals via the line 4 are involved, in which case the micro-processor itself functions as the input signal acquisition circuit, or indirect when they pass through the converter 5, in which case the converter 5 functions as the input signal acquisition circuit. Output is in numerical form, parallel via the bus 6 or numerical in series via the bus 7 or in analogue form via the converter D/A 8 (numerical/analogue).

These outputs 6, 7, 8 are connected to the utiliser circuits IV.

The central unit is connected to a module via the buses 4, 9, 9b, serving for the exchange of signals between the module II and the central unit I and via the bus 10 serving for transmission of order from the central unit I to the module II. The central unit I likewise comprises an electricity supply II, for example a dry or wet cell battery, connected not only to the circuits of the central unit I but also to the module II via the line 12.

The lines 9, 9b are two lines for the transmission of analogue signals from two pick-ups, processed independently in the module so that they can be received and processed independently in the central unit I and not be combined until completion of processing.

However, the module can only be connected to a pick-up (for measuring a signal magnitude or when there is no compensation of the magnitude measured).

Simply, as a single processing circuit receives the signals from two pick-ups, the converter 5 is combined with an electronic selector which alternately connects one or other route.

In the most usual case, the converter 5 is an analogue/numerical A/D converter. It can however likewise be a voltage/frequency converter for example.

The line 10 serves for interrogation of the module II by the central unit I; this interrogation is carried out by an exchange of numerical signals making it possible in particular for the central unit I to know the type of measurement to be carried out, the type of pick-up used, the nature of the signal and whether one or two pick-ups is or are being used.

The type of measurement signifies that it is a measurement of temperature, pH, RH, wind speed, etc.

The type of pick-up makes it possible to determine the constants of linearisation and handling, such as the scale of measurement, resolution of measurement, correction of systematic errors, that is to say errors peculiar to the system.

The nature of the signal makes it possible to know whether a circuit such as a high-pass or low-pass filter should be connected, etc.

In greater detail, the electrical connections between the central unit I and the module II are effected at the moment the module II is placed in position.

The processing programme carried out by the central unit has a number of aims:

To check that the unit is functioning properly.

To interrogate the module to know the type of pick-up, the unit of measurement, the type of signal handling and resolution. The module responds by providing coded numerical information.

To use the numerical information from the module, apply and measure the signal from the pick-up either with the analogue/numerical converter or with the cadence input circuit. If necessary, the circuit also measures the temperature in order to take this into account if temperature compensation is to be applied.

To apply a linearisation equation to the input data which is converted to numerical form. All readings made by pick-ups are temperature corrected, linearised and related to scale.

To check the orders which the user feeds in via the keyboard and relative to calculations of values such as minimum, mean or maximum; change of format of output data.

To provide at the output the data for display and numerical outputs as well as to provide data for the numerical/analogue converter and for operating this converter.

The micro-processor 1 performs four different jobs:

(1) It reads the numerical signal input lines.

(2) It reads and operates the analogue/numerical converter or frequency input.

(3) It carries out linearisation, temperature compensation and relation to scale of the input signals.

(4) It generates output signals corresponding to the result for display, the numerical/analogue converter and the numerical output in a BCD code.

The micro-processor is for example a CMOS eight bit micro-processor.

The analogue/numerical (A/D) converter 5 is for example a CMOS dual-slope converter for 13 (signed) bits. It carries out conversions at a rate of 10 conversions per second, but the display is only renewed three times a second: the micro-processor adds four readings, then the numerical mean to deliver a signal of twelve signed bits.

The A/D converter 5 is controlled by the micro-processor 1. The micro-processor 1 reads the converter A/D 5 or the frequency input. The micro-processor 1 also controls the input lines of the converter A/D 5. The micro-processor 1 chooses either the normal analogue input or the temperature compensated analogue input. According to the module used, so the A/D converter measures only the normal input or if necessary, if temperature compensation is needed, it only reads the input after temperature compensation. The frequency input is controlled internally by the micro-processor. The circuit comprises a 3.579 MHZ crystal oscillator which gives the time base; the accuracy of the input frequency depends entirely on the accuracy of the oscillator crystal.

According to the condition of the control line, the micro-processor accepts one signal over 16 conversions. This arrangement is interesting for carrying out measurements over a very long period.

The 2,000 volts reference voltage is generated by two voltage reference at a stable interval. This voltage provides for calibration of the D/A converter and passes to the output to the module along a constant impedance line.

The analogue output may be positive or negative. The output of the numerical/analogue converter (D/A) 8 is still the same as the BCD parallel output.

The power is supplied by dry or wet cell batteries capable of being charged while the central unit is operating or at a standstill.

The advantages of the central unit are the following:
simplicity of operation,
good battery life,
ease of handling,
viable component,
analogue and numerical output,
alternative power sources
flexibility of production, with a stand, an anti-theft device and an assembly device,
clear numerical display,
low cost.

The modules II which are capable of being located on the central unit I are constructed so that they can accept different pick-ups or families of pick-ups; thus, on average, each module is intended to accommodate about ten pick-ups.

Each module II comprises inputs 13, 13b regrouped on gate A and gate B consisting, for example, of two pairs of multiple pins on which the corresponding pick-up sockets are fitted. The pick-ups III are linked to a selector circuit 14 which switches the pick-ups to the processing or correction circuits 15 which are themselves selectively connected to lines 9, 9b respectively.

In practice, the connection of pick-ups IV to the plugs is coded according to the pins so that the module recognises the pick-up or pick-ups connected.

Although in the most general case the converters are integrated into the central unit, it is likewise feasible to accommodate them in the modules.

The operation of one or more of the compensating and connecting circuits is carried out by the control circuit 16. This control circuit 16 operates correcting circuits 15 either by recognising the connection of the pick-ups to the inputs 13 or by manual intervention by the user who operates the selector button.

The combination circuit 14 is linked to the bus 10 in order to receive orders from the central unit I, for example a clock cadence, a sampling signal for sending signals via the bus 9.

Information concerning identity of the module II, of the pick-up(s) connected to the module, the type of compensation controlled by the circuit 16, are transmitted to the central unit I so that the latter may take this information into account when processing signals.

A specific module is provided for each of the four types of handling circuits:

(a) a temperature compensating circuit,
(b) a circuit requiring linearisation,
(c) a handling circuit with different numerical information for different modules in order to obtain a multiple function module, (d) a specialised circuit for certain applications.

The modules can also mix circuits, for example provide for temperature compensation and multi-functional applications, etc.

By way of example, the modules II are fixed mechanically on the central unit I by two kinds of means:

(1) A fifteen-pin connector to ensure linking lines carrying analogue/numerical signals and control signals. This type of connector is self-supporting.

(2) Furthermore, the module penetrates the casing of the central unit by a certain amount to reinforce the rigidity of the connection with two locking clips.

The modules have a number of important advantages:
security fitment on the central unit,
low cost,
flexibility of design,
module is adaptable to a wide diversity of pick-up, either extant or to be designed,
greater accuracy due to control by the central unit micro-processor,
measurement of all the main variables used.

These modules make it possible to resolve various problems of design where remedy is necessary, particularly for the analogue interface and the linearisation of a vast number of different pick-ups. The cost, accuracy and viability have also been taken into account.

The pick-ups III constitute the third part of the apparatus.

It is important that the user should be able to employ the numerous existing pick-ups available for measuring temperature, pH, oxygen, velocity of flow of a medium (wind), already available. Generally there are over 100 pick-ups for temperature, chemical and environmental measurement which can function directly with this unit.

In order to function with these 100 pick-ups, a minimum of 8 modules and one main unit will be required. The advantage accruing therefrom is that the user only requires one main apparatus for all his normal metering requirements; the apparatus is modular and can, therefore be extended subsequently to permit of additional metering.

The pick-ups can be spread over different groups to which different modules II correspond.

The first group of pick-ups requires temperature compensation with possibly a particular linearisation.

The second group corresponds to different temperature pick-ups providing non-linear signals which can be displayed in the form of linear signals.

The third group of pick-ups corresponds to those measuring values relative to the environment and which therefore must be re-grouped so that they can be measured by using one and the same module.

The different utiliser circuits or apparatuses IV are connected to the outputs 6, 7, 8 of the central unit I. The parallel numerical output 6 is for example provided so that it can be connected to a control or alarm 17, a printer 18 or an interface IEEE 19.

The series numerical output 7 is provided to be connected for example to a remote transmission 20, a remote display 21 or a display on the apparatus 22, for example an LED (light emitting diode) display or preferably an LCD (liquid crystal diode) display.

The numerical display is controlled by a four half-digit counter, the micro-processor 1 supplies at its output a train of pulses, the number of which is equal to the display. These pulses are counted and then displayed on the LCD display; the pulses are counted and converted to a BCD format and interlocked for the BCD output.

The display symbols are sent in the form of four coded bits to the display. The decimal point, the symbols "Mini", "Max" and "Mean" are controlled by the micro-processor.

The analogue output 8 is connected either to a control 23 or to a recording device 24.

Figure 2:
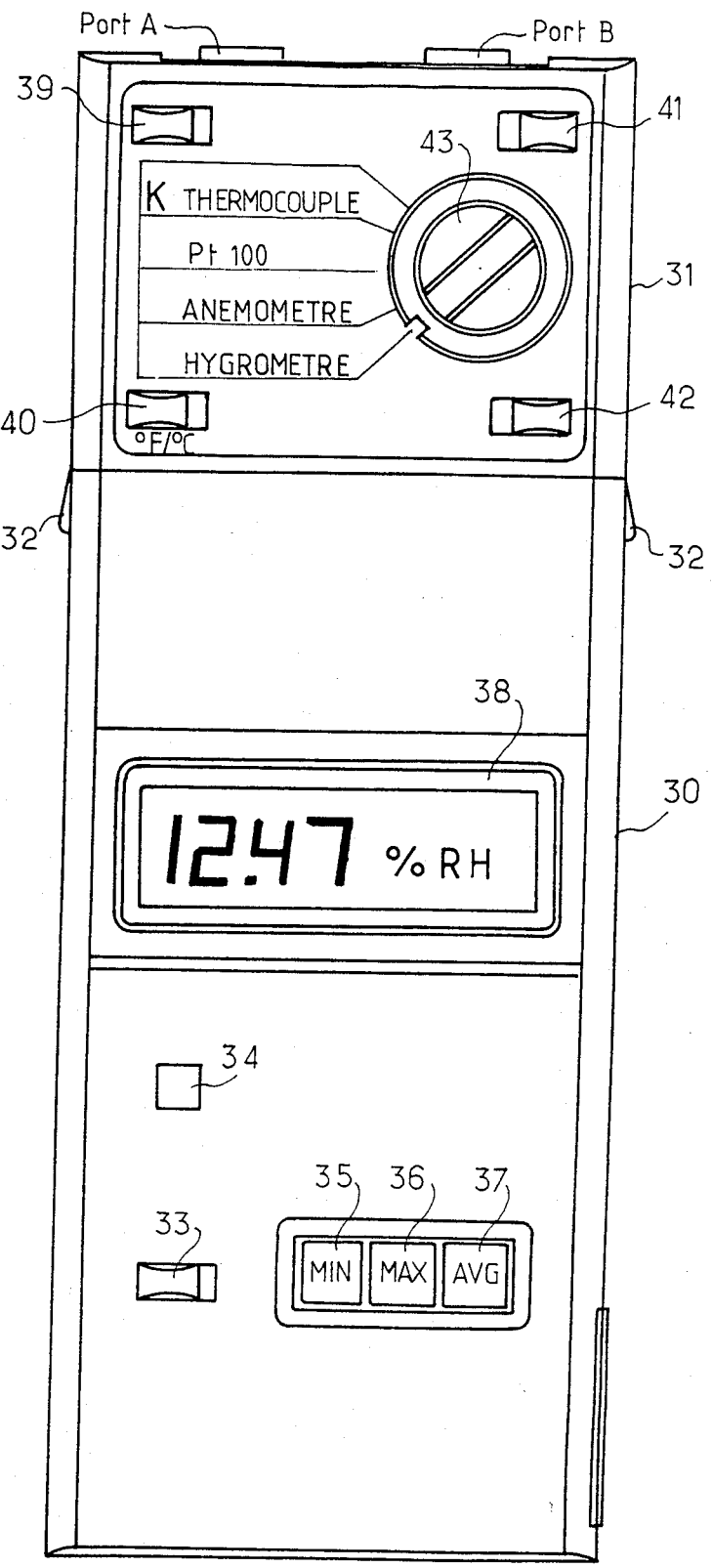
FIG. 2 is a front view of the apparatus showing the central unit and a module.

FIGS. 2 and 3 show a particular embodiment of the central unit I and of a module II.

As shown in FIG. 2, the central unit I is composed of a casing 30 to which the casing 31 of a module II is connected by a housing-type fitment. The electrical connections are made at the same time as the casing 31 is fixed to the casing 30; the housing-type mechanical connection is completed by locking means 32.

On its front face, the casing 30 comprises the following buttons:

Button 33: This button controls the start and stop processes; it may for example be a sliding selector switch (the batteries can be charged even while the unit is stopped).

Button 34: This locks the display on the last number displayed.

Button 35: This controls display of the smallest magnitude (Min) measured since measurement started.

Button 36: This controls display of the largest magnitude (Max) measured since measurement started.

Button 37: This controls display of the mean (AVG) of the results measured.

The front face is likewise occupied by the display device 38 which is preferably of the liquid crystal diode (LCD) type.

Display is controlled by the micro-processor as follows:

(1) When the apparatus is started, the display shows a number such as for example 8888 which guarantees that all the display segments are functioning correctly. The decimal points also appear.

(2) The display automatically restores to scale in case of an overload.

(3) Is a fault code display, for example:
if the range of the A/D converter is exceeded,
if the user requires a greater resolution than is possible,
if there is no input signal for certain measurements.

(4) The zeros preceding the digit displayed are eliminated insofar as such zeros are unnecessary.

The front face of the casing 31 comprises different operating buttons 39, 40, 41, 42 corresponding for example to use of a filter, the choice of a range of temperature, the choice of temperature compensation, etc. The pick-up is chosen by the selector button 43 which at the same time controls the device 16 (FIG. 1). In the example illustrated, there are different temperature pick-ups, that is to say different thermocouples.

According to FIG. 3, the rear face of the casings 30, 31 comprises non-skid shoes 43 and a retractable stand 44. This drawing likewise shows a flap 46 covering the wet or dry battery housing and the non-slip ribs 47 which facilitate gripping.

We claim:

1. Multi-probe metering apparatus for measuring electrical magnitude or magnitudes associated with electrical magnitudes and for displaying the results or for transmitting them to users, the apparatus being characterised by a modular structure consisting of a central unit (I) comprising an input signal acquisition circuit providing signals for a memory processing circuit (1, 2, 3) supplying the display means and signal output means for users (19, 24) of at least one detachable module (II) establishing a link between the central unit (I) and a pick-up or pick-ups (III), the said module (II) being associated with one or a plurality of specific pick-ups (III), the said module (II) being itself connected (4, 9, 10) to the central unit (1) by electrical connections which are established at the same time as the mechanical connection is made between the module (II) and the central unit (I), each module (II) comprising processing circuits (15) linked to the pick-ups (III) which the module (II) is capable of accepting, and means (16, gate A, gate B) supplying the central unit (I) with information to identify the pick-up or pick-ups (III) with which the module (II) is associated in order to control within the central unit (I) the corresponding treatment of the signals provided by the pick-up(s) (III), each module having two input gates connected by two distinct routes to the central unit which receives and processes separately and independently the signals emanating from the two routes, after which it combines them.

2. Apparatus according to claim 1, characterized in that the input signal acquisition circuit is an analogue/numerical converter or voltage/frequency converter combined with a selector means.

3. Apparatus according to claim 2, characterized in that the converter is integrated into a module.

4. Apparatus according to claim 1, characterised in that the pick-up identification signals are numerical signals while the metering signals are analogue signals.

5. Apparatus according to claim 1, characterised in that the information identifying the pick-ups controls parameters for linearisation of the numerical signals corresponding to the analogue signals in the central processing unit (I).

6. Apparatus according to claim 1, characterized in that the module (II) comprises compensating circuits (15) for compensating according to different parameters such as temperature and pressure.

7. Apparatus according to claim 1, characterised in that the central unit comprises means (34–37) for controlling the display of magnitudes such as: minimum, maximum, mean, or for locking the display for a certain period.

8. Apparatus according to claim 1, characterised in that each module (II) comprises a selector (16, 43) for selecting an operating mode.

9. Apparatus according to claim 2 characterized in that the converter is integrated into a module.

* * * * *